United States Patent
Kajita

(12) United States Patent (10) Patent No.: US 6,465,746 B1
(45) Date of Patent: Oct. 15, 2002

(54) OSCILLATOR ATTACHMENT STRUCTURE PREVENTING INTERFERENCE BY BEAT SIGNAL

(75) Inventor: Kazutoyo Kajita, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/690,664

(22) Filed: Oct. 17, 2000

(30) Foreign Application Priority Data

Oct. 21, 1999 (JP) .............................. 11-299485

(51) Int. Cl.⁷ ................................ H05K 1/16
(52) U.S. Cl. .................. 174/260; 174/51; 174/52.3; 361/811; 361/808
(58) Field of Search ................ 174/262, 263, 174/264, 265, 266, 51, 52.1, 52.3, 52.4; 257/698; 228/170.1, 180.1; 361/807, 808, 809, 810, 811

(56) References Cited

U.S. PATENT DOCUMENTS

| | | | |
|---|---|---|---|
| 4,034,318 A | | 7/1977 | Ishiyama et al. |
| 4,855,869 A | * | 8/1989 | Tsuji |
| 4,860,166 A | * | 8/1989 | Nicholls |
| 5,311,402 A | * | 5/1994 | Kobayashi et al. ......... 361/760 |
| 6,075,700 A | * | 6/2000 | Houghto et al. ............ 361/704 |
| 6,239,360 B1 | * | 5/2001 | Kato et al. ................. 174/35 R |

FOREIGN PATENT DOCUMENTS

| | | |
|---|---|---|
| EP | 0910163 | 4/1999 |
| JP | 10252178 | 9/1998 |
| JP | 11-186845 | 7/1999 |

OTHER PUBLICATIONS

European Search Report, issued Mar. 19, 2002, corresponding to EPA No. 00308956.2

* cited by examiner

Primary Examiner—Kamand Cuneo
(74) Attorney, Agent, or Firm—Brinks Hofer Gilson & Lione

(57) ABSTRACT

An oscillator attachment structure which prevents interference by a beat signal caused by mixture of a reference oscillation signal from a PLL circuit and an oscillation signal from an oscillator. A plate conductive rubber plate, electrically connected to a ground conductor, is provided on the lower surface of a circuit board, and the conductive rubber plate is disposed on a ground conductive member of a printed circuit board. The ground conductor and the ground conductive member are electrically connected to each other, and the circuit board can be sufficiently grounded to the PLL circuit on the printed circuit board.

6 Claims, 3 Drawing Sheets

OSCILLATOR ATTACHMENT STRUCTURE PREVENTING INTERFERENCE BY BEAT SIGNAL

BACKGROUND OF THE INVENTION

1. Field of the Invention

The present invention relates to an oscillator attachment structure used in e.g. a head end of CATV transmitter.

2. Description of the Related Art

A conventional oscillator attachment structure will be described with reference to FIGS. 4 to 6. An oscillator 31 has a box-shaped frame body 32 of metal plates having attachment legs 32a, a circuit board 35 having a wiring pattern 33 on its upper surface and a ground conductor 34 on its approximately entire lower surface, various electric components 36 soldered to the wiring pattern 33, connection pins 37 soldered to the wiring pattern 33 and projecting downward through the circuit board 35, and a metal cover 38 over the frame body 32.

Further, the connection pins 37 include plural power-source connection pins 37a provided in left and right positions, a tuning connection pin 37b, an output connection pin 37c and a ground connection pin 37d positioned between the power-source connection pins 37a. The connection pins 37 are not electrically connected to the ground conductor 34, being isolated from the ground conductor 34 by relief members 34a comprising rejection members provided in the ground conductor 34.

A printed circuit board 41 comprising a mother board that forms a head end of the transmitter holds a ground conductive member 42 on its upper surface, a wiring pattern 43 on its lower surface, and various electric components 44 soldered to the wiring pattern 43, and the.

Further, a buffer member 45 is formed with a rubber member 46 and adhesive 47 provided on the lower surface of the rubber member 46. The rubber member 46 is insulating and formed in a plate, i.e. planar, shape. The buffer member 45 is attached to the upper surface of the ground conductive member 42 of the printed circuit board 41 by the adhesive 47.

Further, a PLL circuit (not shown) is formed in the wiring pattern 43 opposite to the buffer member 45.

In the above-described oscillator 31, the attachment legs 32a of the frame body 32 and the power-source connection pins 37a are inserted into holes of the printed circuit board 41, and the tuning connection pin 37b, the output connection pin 37c and the ground connection pin 37d are inserted through holes of the buffer member 45 and the printed circuit board 41. The lower surface of the circuit board 35 is disposeddisposed on the rubber member 46. In this state, the connection pins 37 and the attachment legs 32a are soldered to the wiring pattern 43, thus the oscillator 31 is mounted on the printed circuit board 41.

The power-source connection pins 37a and the tuning connection pin 37b are not electrically connected to the ground conductive member 42 by the relief members 42a.

In the oscillator attachment structure having the above construction, fluctuations of an oscillation waveform from the oscillator 31 due to shock and vibration from the printed circuit board 41 side, e.g. f skip, are prevented by the buffer member 45.

However, as the rubber member 46 of insulating material is used, a capacitance formed between the ground conductor 34 of the circuit board 35 and the ground conductive member 42 of the printed circuit board 41 is small. One result of this is that the circuit board 35 is not sufficiently grounded to the printed circuit board 41 in a so-called electrically floating state.

As a result, a reference oscillation signal from the PLL circuit formed on the printed circuit board 41 side influences the circuit board 35 side. The signal is mixed with the oscillation signal from the oscillator, which causes a beat signal as an interference signal.

SUMMARY OF THE INVENTION

The present invention has been made in consideration of the above situation, and provides an oscillator attachment structure which prevents an interference signal (more specifically) a beat signal and attains excellent performance.

According to one aspect of the present invention, the foregoing object is attained by providing an oscillator attachment structure comprising: a metal frame and a first circuit board having a first ground conductor on a lower surface thereof. The first circuit board is attached within the frame. A printed circuit board has a second ground conductor on an upper surface thereof. The oscillator is attached to the upper surface of the first circuit board. A conductive rubber plate, electrically connected to the first ground conductor, is provided on the lower surface of the first circuit board, and the conductive rubber plate is disposed on the second ground conductor. Further, according to another aspect of the present invention, the foregoing object is attained by providing an oscillator attachment structure comprising: a metal frame and a first circuit board having a first ground conductor on a lower surface thereof. The first circuit board is attached within the frame. A printed circuit board has a second ground conductor on an upper surface thereof. An oscillator is attached to an upper surface of the first circuit board. A thin insulating member disposed on the second ground conductor. A conductive rubber plate, electrically connected to the first ground conductor, is provided on the lower surface of the first circuit board, and the conductive rubber plate is disposed on the thin insulating member.

Further, according to another aspect of the present invention, the foregoing object is attained by providing the oscillator attachment structure, wherein the insulating member comprises a double-faced adhesive tape, and wherein the conductive rubber plate and the ground conductor are attached to each other by the double-faced adhesive tape.

Further, according to another aspect of the present invention, the foregoing object is attained by providing the oscillator attachment structure, wherein conductive grease is provided between the conductive rubber plate and the first ground conductor.

Other features and advantages of the present invention will be apparent from the following description taken in conjunction with the accompanying drawings, in which like reference characters designate the same name or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENT

A preferred embodiment of the present invention will now be described in detail in accordance with the accompanying drawings.

Figure 1:
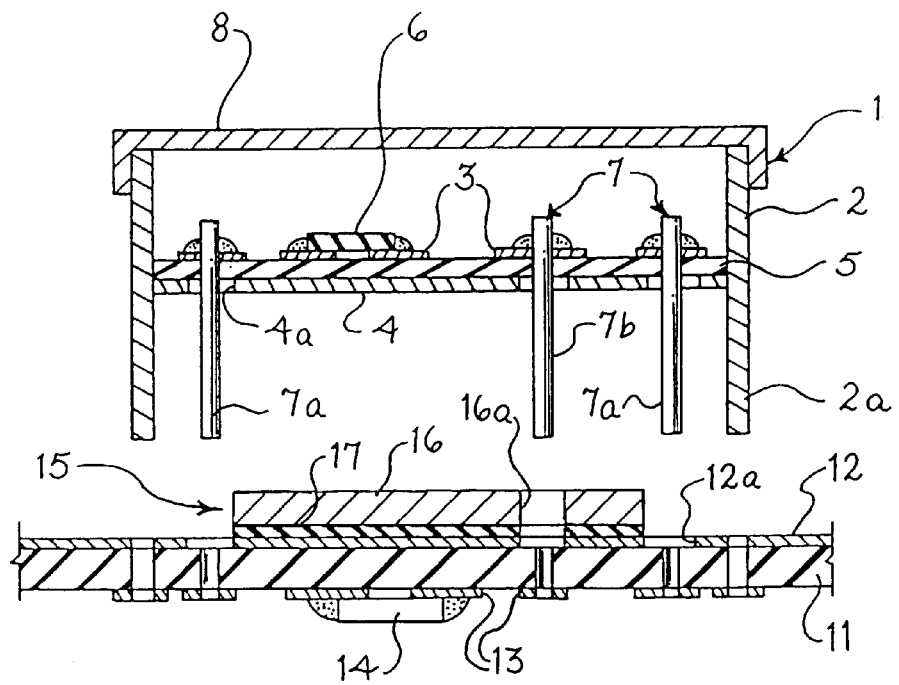
FIG. 1 is an exploded cross-sectional view of an oscillator attachment structure according to the present invention.
Figure 2:
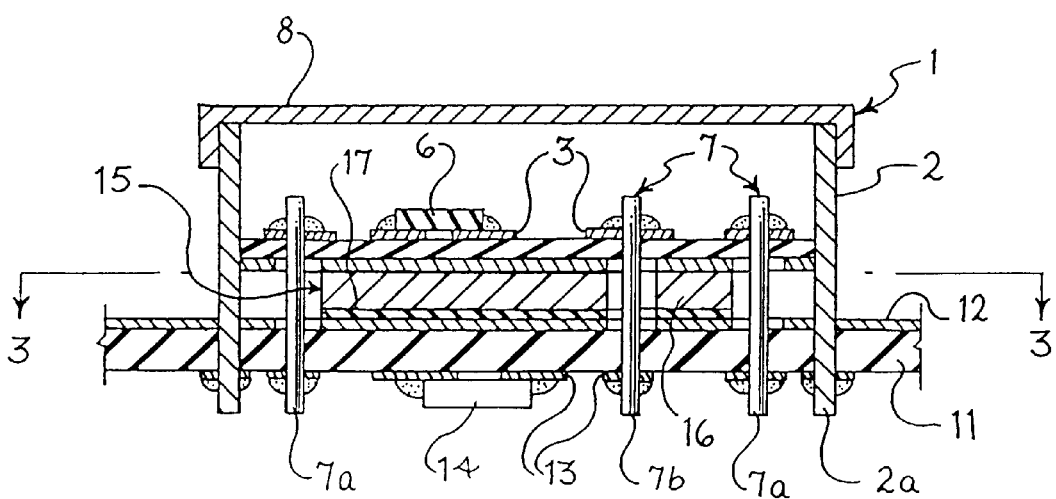
FIG. 2 is a cross-sectional view showing principal elements of the oscillator attachment structure according to the present invention.
Figure 3:
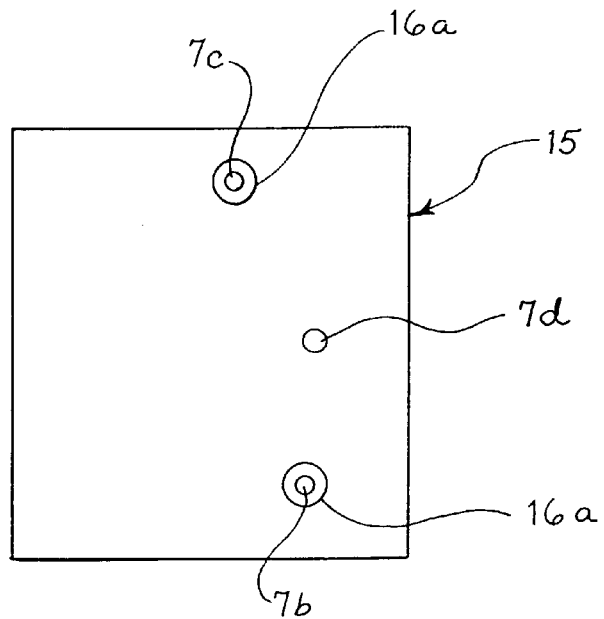
FIG. 3 is a cross-sectional view cut along a line 3—3 in FIG. 2 showing the principal elements.
Figure 4:
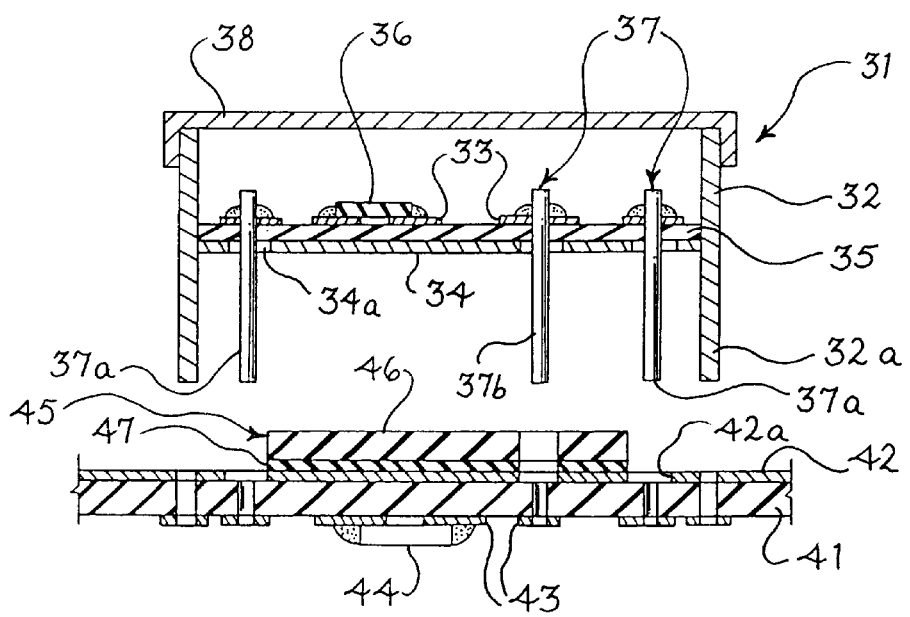
FIG. 4 is an exploded cross-sectional view of the conventional oscillator attachment structure.
Figure 5:
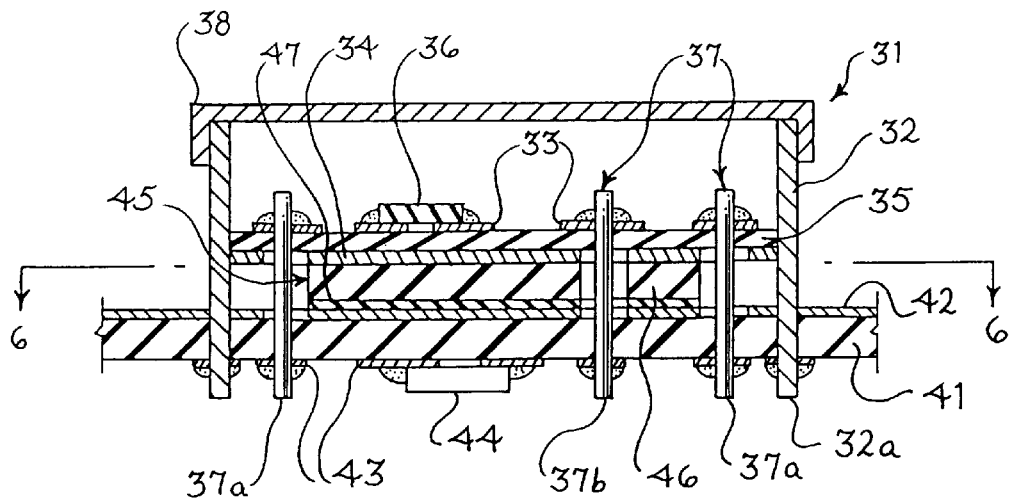
FIG. 5 is a cross-sectional view showing principal elements of the conventional oscillator attachment structure.
Figure 6:
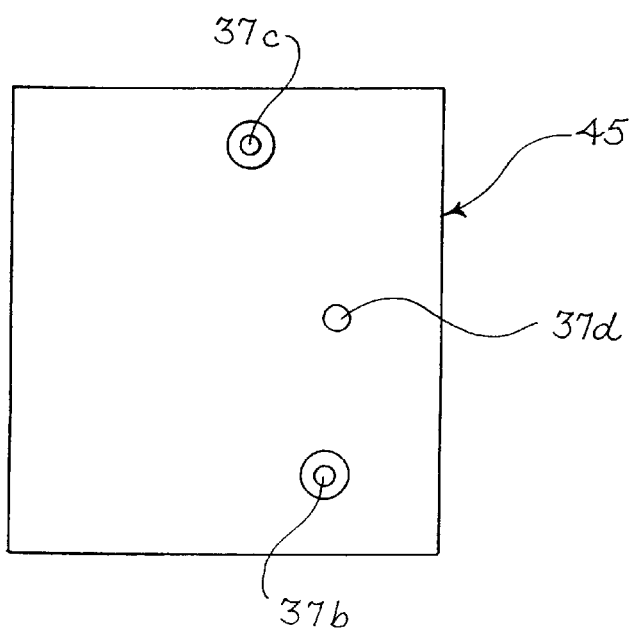
FIG. 6 is a cross-sectional view cut along a line 6—6 in FIG. 5 showing the principal elements.

An oscillator attachment structure according to the present invention will be described with reference to FIGS. 1 to 3. The oscillator 1 has a box-shaped frame body 2 of metal plates having attachment legs 2a, a circuit board 5 having a wiring pattern 3 on an upper surface and a ground conductor 4 on approximately the entire lower surface, various electric components 6 soldered to the wiring pattern 3, connection pins 7 soldered to the wiring pattern 3 and projecting downward through the circuit board 5, a metal cover 8 over the frame body 2, .

The connection pins 7 include plural power-source connection pins 7a provided in left and right positions, a tuning connection pin 7b, an output connection pin 7c and a ground connection pin 7d provided between the power-source connection pins 7a. The connection pins 7 are not electrically connected to the ground conductor 4, being isolated from the ground conductor 4 by relief members 4a of rejection members provided in the ground conductor 4.

A printed circuit board 11 comprising a mother board that forms a head end of the transmitter holds a ground conductive member 12 on its upper surface, a wiring pattern 13 on its lower surface, and various electric components 14 soldered to the wiring pattern 13.

Further, a buffer member 15 is formed with a conductive rubber plate 16 and an insulating member 17. The insulating member 17 comprises a thin-sheet double-faced adhesive tape and is provided on the lower surface of the conductive rubber plate 16. The insulating member 17 is also formed in a plate shape. The buffer member 15 is attached to the upper surface of the ground conductive member 12 of the printed circuit board 11 by the insulating member 17.

Further, a PLL circuit (not shown) is formed in the wiring pattern 13 opposite to the buffer member 15.

In the above-described oscillator 1, the attachment legs 2a of the frame body 2 and the power-source connection pins 7a are inserted into holes of the printed circuit board 11, and the tuning connection pin 7b, the output connection pin 7c and the ground connection pin 7d are inserted through holes of the buffer member 15 and the printed circuit board 11. Further, the lower surface of the circuit board 5 is disposed on the conductive rubber plate 16, and the conductive rubber plate 16 is electrically connected to the ground conductor 4. In this state, the connection pins 7 and the attachment legs 2a are soldered to the wiring pattern 13, thus the oscillator 1 is mounted on the printed circuit board 11.

As above, the power-source connection pins 7a and the tuning connection pin 7b are electrically isolated from the ground conductive member 12 by relief members 12a, and the tuning connection pin 7a and the output connection pin 7c are electrically isolated from the conductive rubber plate 16. The relief members 16a comprise large holes provided in the conductive rubber plate 16.

In the oscillator attachment structure having the above construction, fluctuations of oscillation waveform from the oscillator 1 due to shock and vibration from the printed circuit board 1, e.g. f skip, are prevented by the buffer member 15.

The conductive rubber plate 16 of conductive rubber material is electrically connected to the ground conductor 4, and the conductive rubber plate 16 and the ground conductive member 12 are in close proximity through a thin insulating member 17. This causes a large capacitance between the ground conductor 4 of the circuit board 5 and the ground conductive member 12 of the printed circuit board 11. The ground conductor 4 and the ground conductive member 12 attain the same potential (when using alternating current) and thereby sufficiently grounds the circuit board 5 to the PLL circuit on the printed circuit board 11.

As a result, a reference oscillation signal from the PLL circuit formed on the printed circuit board 11 side does not influence the circuit board 5 side, thereby preventing interference and specifically beat signals from occurring.

Note that in the above embodiment, a double-faced adhesive tape is used as the insulating member 17, however, in another embodiment the insulating member 17 is omitted and the conductive rubber plate 16 directly electrically connected to the ground conductor 4 and the ground conductive member 12. In this case, a capacitance is not formed between the ground conductor 4 and the ground conductive member 12, resulting in a more reliable ground therebetween. Thus a high-performance oscillator can be provided.

Conductive grease may also be provided between the ground conductor 4 and the conductive rubber plate 16, thereby improving the electrical connection therebetween.

In the oscillator attachment structure according to the present invention, the conductive rubber plate 16 is provided on the lower surface of the circuit board 5 and the conductive rubber plate 16 is disposed on the ground conductive member 12. As the ground conductor 4 and the ground conductive member 12 are electrically connected to each other, the printed circuit board 11 can be sufficiently grounded to the PLL circuit on the circuit board 5.

As a result, the reference oscillation signal from the PLL circuit formed on the printed circuit board 11 side does not influence the circuit board 5 side, thereby preventing interference and specifically beat signals from occurring.

Further , the conductive rubber plate 16, electrically connected to the ground conductor 4, is provided on the lower surface of the circuit board 5, and the conductive rubber plate 16 is disposed on the ground conductive member 12 through the thin-plate insulating member 17. As the conductive rubber plate 16 and the ground conductive member 12 are in close proximity through the thin insulating member 17, a large capacitance is formed between the ground conductor 4 of the circuit board 5 and the ground conductive member 12 of the printed circuit board 11. The ground conductor 4 and the ground conductive member 12 thus attain the same potential (when using alternating current), and thereby sufficiently grounds the circuit board 5 to the PLL circuit on the printed circuit board 11.

As a result, the reference oscillation signal from the PLL circuit formed on the printed circuit board 11 side does not influence the circuit board 5 side, thus an oscillator attachment structure can be provided which prevents an interference signal, specifically a beat signal, from occuring.

Further, as the insulating member 17 is a double-faced adhesive tape and the conductive rubber plate 16 and the ground conductive member 12 are attached to each other by the double-faced adhesive tape, the attachment of the conductive rubber plate 16 is simple. Thus, a high-producibility oscillator attachment structure can be provided.

Further, as conductive grease may be provided between the conductive rubber plate 16 and the ground conductor 4, the electrical connection therebetween can be improved.

The present invention is not limited to the above embodiment and various changes and modifications can be made within the spirit and scope of the present invention. Therefore, to appraise the public of the scope of the present invention, the following claims are made.

What is claimed is:

1. An oscillator attachment structure comprising:

a metal frame;

a first circuit board having a first ground conductor on a lower surface thereof and being attached within the frame;

a printed circuit board having a second ground conductor on an upper surface thereof;

an oscillator attached to an upper surface of the first circuit board; and a conductive rubber plate configured to conduct to the first ground conductor and is provided on the lower surface of the first circuit board, the conductive rubber plate being disposed on the second ground conductor.

2. An oscillator attachment structure comprising:

a metal frame;

a first circuit board having a first ground conductor on a lower surface thereof and being attached within the frame;

a printed circuit board having a second ground conductor on an upper surface thereof;

an oscillator attached to an upper surface of the first circuit board;

a thin insulating member disposed on the second ground conductor; and a conductive rubber plate configured to conduct to the first ground conductor and being provided on the lower surface of the first circuit board, the conductive rubber plate being disposed on the insulating member.

3. The oscillator attachment structure according to claim 2, wherein the insulating member comprises a double-faced adhesive tape, and wherein the conductive rubber plate and the second ground conductor are adhered to each other by the doublefaced adhesive tape.

4. The oscillator attachment structure according to claim 1, wherein conductive grease is interposed between the conductive rubber plate and the first ground conductor.

5. The oscillator attachment structure according to claim 2, wherein conductive grease is interposed between the conductive rubber plate and the first ground conductor.

6. The oscillator attachment structure according to claim 3, wherein conductive grease is interposed between the conductive rubber plate and the first ground conductor.

* * * * *

UNITED STATES PATENT AND TRADEMARK OFFICE
CERTIFICATE OF CORRECTION

PATENT NO. : 6,465,746 B1
DATED : October 15, 2002
INVENTOR(S) : Kazutoyo Kajita It is certified that error appears in the above-identified patent and that said Letters Patent is hereby corrected as shown below:

Column 6,
Line 5, delete "doublefaced" and substitute -- double-faced -- in its place.

Signed and Sealed this

Fourth Day of March, 2003

JAMES E. ROGAN
*Director of the United States Patent and Trademark Office*